(12) United States Patent
Lee et al.

(10) Patent No.: US 10,403,715 B2
(45) Date of Patent: Sep. 3, 2019

(54) SEMICONDUCTOR DEVICE

(71) Applicant: United Microelectronics Corp., Hsinchu (TW)

(72) Inventors: Rung-Yuan Lee, New Taipei (TW); Chun-Tsen Lu, Tainan (TW); Kuan-Hung Chen, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 16/222,709

(22) Filed: Dec. 17, 2018

(65) Prior Publication Data

US 2019/0140051 A1    May 9, 2019

Related U.S. Application Data

(62) Division of application No. 15/783,823, filed on Oct. 13, 2017, now Pat. No. 10,204,986.

(30) Foreign Application Priority Data

Sep. 11, 2017    (CN) .......................... 2017 1 0811002

(51) Int. Cl.
| | |
|---|---|
| *H01L 29/06* | (2006.01) |
| *H01L 29/423* | (2006.01) |
| *H01L 29/41* | (2006.01) |
| *H01L 29/417* | (2006.01) |
| *H01L 23/535* | (2006.01) |
| *H01L 21/306* | (2006.01) |
| *H01L 29/66* | (2006.01) |
| *H01L 21/308* | (2006.01) |
| *H01L 29/786* | (2006.01) |

(Continued)

(52) U.S. Cl.
CPC ........ *H01L 29/0676* (2013.01); *H01L 21/308* (2013.01); *H01L 21/30604* (2013.01); *H01L 21/84* (2013.01); *H01L 23/535* (2013.01); *H01L 27/1203* (2013.01); *H01L 29/0649* (2013.01); *H01L 29/413* (2013.01); *H01L 29/41733* (2013.01); *H01L 29/41741* (2013.01); *H01L 29/42392* (2013.01); *H01L 29/66545* (2013.01); *H01L 29/66742* (2013.01); *H01L 29/78642* (2013.01)

(58) Field of Classification Search
CPC ................................................... H01L 29/0676
See application file for complete search history.

(56) References Cited

U.S. PATENT DOCUMENTS

| | | | | |
|---|---|---|---|---|
| 2014/0084370 A1* | 3/2014 | Cappellani | ............ | H01L 29/786 257/347 |
| 2015/0017802 A1 | 1/2015 | Yim et al. | | |

(Continued)

*Primary Examiner* — Walter H Swanson
(74) *Attorney, Agent, or Firm* — J.C. Patents

(57) ABSTRACT

A semiconductor device is provided. The semiconductor device includes a substrate, a semiconductor nanowire, a gate structure, a first metal nanowire and a second metal nanowire. The semiconductor nanowire is disposed vertically on the substrate. The gate structure surrounds a middle portion of the semiconductor nanowire. The first metal nanowire is located on a side of the semiconductor nanowire and is electronically connected to a lower portion of the semiconductor nanowire. The second metal nanowire is located on the other side of the semiconductor nanowire and is electronically connected to the gate structure.

9 Claims, 8 Drawing Sheets

(51) Int. Cl.
*H01L 21/84* (2006.01)
*H01L 27/12* (2006.01)

(56) References Cited

U.S. PATENT DOCUMENTS

| | | |
|---|---|---|
| 2015/0270349 A1 | 9/2015 | Cheng et al. |
| 2015/0348848 A1 | 12/2015 | Fu et al. |
| 2016/0155857 A1 | 6/2016 | Masuoka et al. |
| 2016/0204276 A1 | 7/2016 | Dasgupta et al. |
| 2016/0247938 A1 | 8/2016 | Masuoka et al. |
| 2016/0336430 A1 | 11/2016 | Tai et al. |
| 2017/0222024 A1 | 8/2017 | Bergendahl et al. |
| 2018/0061992 A1* | 3/2018 | Bergendahl ......... H01L 29/0673 |

* cited by examiner

SEMICONDUCTOR DEVICE

CROSS-REFERENCE TO RELATED APPLICATION

This application is a divisional application of and claims the priority benefit of U.S. application Ser. No. 15/783,823, filed on Oct. 13, 2017, now allowed, which claims the priority benefit of China application serial no. 201710811002.2, filed on Sep. 11, 2017. The entirety of each of the above-mentioned patent applications is hereby incorporated by reference herein and made a part of this specification.

BACKGROUND OF THE INVENTION

Field of the Invention

The invention relates to an integrated circuit and particularly relates to a semiconductor device.

Description of Related Art

With rapid advancement of semiconductor fabricating technology, in order to improve the speed and performance of device, the circuit device is bound to shrink continuously in an overall size for increasing the integration level of the device. Currently, the three-dimensional or non-planar multi-gate transistor device has been developed to replace the planar transistor device. For example, non-planar multi-gate transistor devices such as dual-gate fin field effect transistor (FinFET) device, tri-gate FinFET device and omega (Ω) FinFET device have been proposed. Now even the gate-all-around (GAA) transistor device using a nanowire as a channel is developed as a solution to keep enhancing the integration level and performance of device. However, the interconnect in a traditional nanowire transistor device is overly complicated, so the chip has to occupy a greater area.

SUMMARY OF THE INVENTION

The invention provides a semiconductor device, wherein one of a plurality of semiconductor nanowires is substituted by a metal nanowire to form a source contact, drain contact, or gate contact and to thereby reduce a chip area.

The invention provides a semiconductor device including a substrate, a semiconductor nanowire, a gate structure, a first metal nanowire and a second metal nanowire. The semiconductor nanowire is disposed vertically on the substrate. The gate structure surrounds a middle portion of the semiconductor nanowire. The first metal nanowire is located on a side of the semiconductor nanowire and is electronically connected to a lower portion of the semiconductor nanowire. The second metal nanowire is located on another side of the semiconductor nanowire and is electronically connected to the gate structure.

In an embodiment of the invention, the first metal nanowire includes an L-shaped structure.

In an embodiment of the invention, the number of the semiconductor nanowire is plural, and the plurality of semiconductor nanowires are arranged in a plurality of rows and a plurality of columns.

In an embodiment of the invention, the plurality of semiconductor nanowires surround the first metal nanowire and the second metal nanowire.

In an embodiment of the invention, at least two of the plurality of semiconductor nanowires surrounding the first metal nanowire are electrically connected to the first metal nanowire.

In an embodiment of the invention, at least two of the plurality of semiconductor nanowires surrounding the second metal nanowire are electrically connected to the second metal nanowire via a corresponding gate structure.

In an embodiment of the invention, the semiconductor device further includes an isolation layer disposed between the substrate and the semiconductor nanowire, between the substrate and the first metal nanowire and between the substrate and the second metal nanowire.

In an embodiment of the invention, the semiconductor device further includes an interconnect disposed on a top surface of the semiconductor nanowire.

In an embodiment of the invention, the gate structure includes a gate dielectric layer and a gate electrode. The gate dielectric layer is located between the gate electrode and the middle portion of the semiconductor nanowire, and the gate electrode is located between the gate dielectric layer and the second metal nanowire.

Based on the above, in the invention, one of a plurality of semiconductor nanowires is substituted by a metal nanowire to form a source contact, drain contact or gate contact, and a chip area thereby reduces. Therefore, a nanowire transistor device of the invention may be further miniaturized to satisfy the users' needs.

To make the aforementioned and other features and advantages of the invention more comprehensible, several embodiments accompanied with drawings are described in detail as follows.

DESCRIPTION OF THE EMBODIMENTS

Figure 1A:
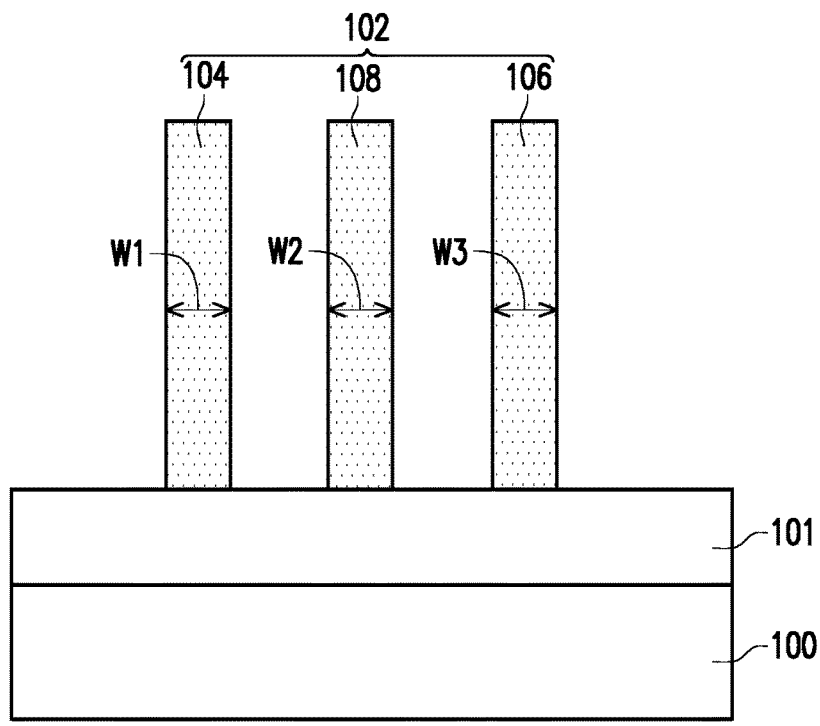
FIG. 1A to FIG. 1K are schematic section views of a manufacturing process of a semiconductor device according to a first embodiment of the invention.

The accompanying drawings are included to provide a further understanding of the invention, and are incorporated in and constitute a part of this specification. The drawings illustrate exemplary embodiments of the invention and, together with the description, serve to explain the principles of the invention. Nevertheless, the invention may be embodied in many different forms and should not be construed as being limited to the embodiments set forth in the specification. A thickness of a layer and a thickness of a region may be enlarged in the drawings for the sake of clarity. It should be noted that the reference numerals and part of the contents of the previous embodiment are used in the following embodiments, in which identical reference numerals indicate identical or similar components, and repeated description of the same technical contents is omitted. Please refer to the description of the previous embodiment for the omitted contents, which will not be repeated hereinafter.

FIG. 1A to FIG. 1K are schematic section views of a manufacturing process of a semiconductor device according to a first embodiment of the invention.

Please refer to FIG. 1A. First, an isolation layer 101 is formed on a substrate 100. In an embodiment of the invention, the substrate 100 may be a semiconductor substrate, a semiconductor compound substrate or a semiconductor over insulator (SOI), for example. The semiconductor may be atoms in IVA group, for example, such as silicon or germanium. The semiconductor compound is, for example, a semiconductor compound formed by atoms in IVA group, such as silicon carbide or silicon-germanium, or a semiconductor compound formed by atoms in IIIA group and atoms in VA group, such as gallium arsenide. In an embodiment of the invention, the isolation layer includes a dielectric material. The dielectric material includes silicon oxide, silicon nitride, silicon oxynitride or a material with a small dielectric constant smaller than 4.

Then, a semiconductor nanowire group 102 is formed to be disposed on the isolation layer 101 and vertically to a top surface of the substrate 100. Specifically, the semiconductor nanowire group 102 includes a first semiconductor nanowire 104, a second semiconductor nanowire 106 and a third semiconductor nanowire 108. The third semiconductor nanowire 108 is located between the first semiconductor nanowire 104 and the second semiconductor nanowire 106. As shown in FIG. 1A, the first semiconductor nanowire 104, the second semiconductor nanowire 106 and the third semiconductor nanowire 108 are separated from and are not connected to one another. In an embodiment of the invention, a material of the semiconductor nanowire group 102 includes silicon, germanium, or a combination thereof. In an embodiment of the invention, a width (or diameter) W1 of the first semiconductor nanowire 104 may fall within a range from 4 nm to 10 nm, a width (or diameter) W2 of the second semiconductor nanowire 106 may fall within a range from 4 nm to 10 nm, and a width (or diameter) W3 of the third semiconductor nanowire 108 may fall within a range from 4 nm to 10 nm. In an embodiment of the invention, the width W1, the width W2 and the width W3 may be identical to one another. However, the invention is not limited thereto. In other embodiments of the invention, the width W1, the width W2 and the width W3 may be different from one another.

In an embodiment of the invention, the first semiconductor nanowire 104, the second semiconductor nanowire 106 and the third semiconductor nanowire 108 may be column structures separated from one another. The column structures include a circular column structure, an oval column structure, a polygon column structure, an irregular-shaped column structure, etc. A forming method of the first semiconductor nanowire 104, the second semiconductor nanowire 106 and the third semiconductor nanowire 108 is as follows. In an embodiment of the invention, a semiconductor layer (a silicon layer, a germanium layer or a silicon-germanium layer, for example,) may be formed on the isolation layer 101. Then, a multi-patterning process is performed on the semiconductor layer to form the semiconductor nanowire group 102 disposed on the isolation layer 101 and vertically to the top surface of the substrate 100. However, the invention is not limited thereto. In other embodiments of the invention, the semiconductor nanowire group 102 disposed vertically to the top surface of the substrate 100 may be formed by an epitaxial growth method as well.

Figure 1B:
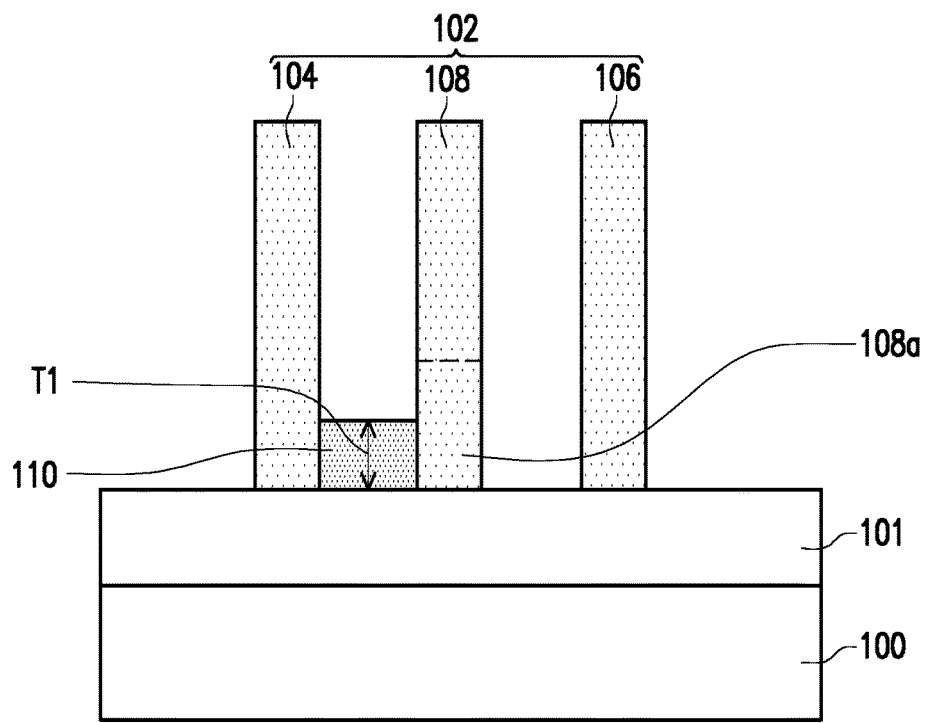

Please refer to FIG. 1B. A dummy layer 110 is formed on the substrate 100 between the first semiconductor nanowire 104 and the third semiconductor nanowire 108. Specifically, a dummy material (not illustrated) may be formed on the substrate 100. Then, the dummy material is patterned so as for a residue of the dummy material (referred to as a dummy layer 110 in the following) to be disposed only on the substrate 100 between the first semiconductor nanowire 104 and the third semiconductor nanowire 108. In an embodiment of the invention, the dummy material or the dummy layer 110 includes a silicon-based material. The silicon-based material may be, for example, silicon, germanium, or a combination thereof. In an embodiment of the invention, a thickness T1 of the dummy layer 110 may fall within a range from 5 nm to 40 nm. However, the invention is not limited thereto. In other embodiments of the invention, a dummy layer 110 falls within the scope of the invention as long as the dummy layer 110 covers a part of a sidewall of a lower portion 108a of the third semiconductor nanowire 108.

Figure 1C:
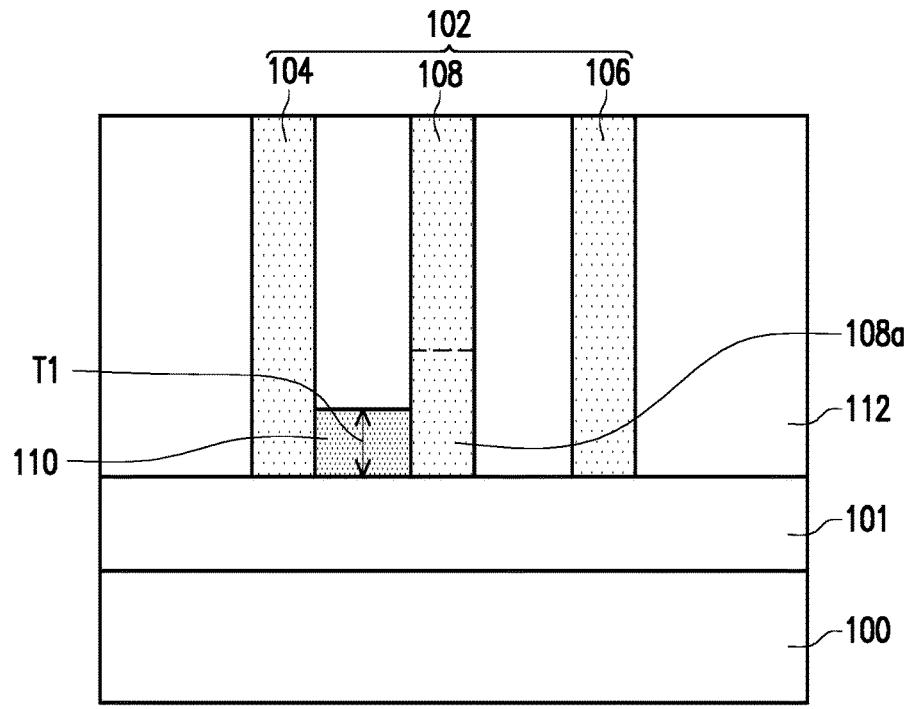

Please refer to FIG. 1C. A first dielectric material 112 is formed on the substrate 100 to fill a space between the first semiconductor nanowire 104, the second semiconductor nanowire 106 and the third semiconductor nanowire 108. In an embodiment of the invention, the first dielectric material 112 includes a flowable dielectric material, for example, a dielectric material having a better gap-fill ability, such as flowable oxide, spin on dielectric (SOD), etc. In an embodiment of the invention, a forming method of the first dielectric material 112 includes filling the dielectric material in the space between the first semiconductor nanowire 104, the second semiconductor nanowire 106 and the third semiconductor nanowire 108 and covering a top surface of the first semiconductor nanowire 104, a top surface of the second semiconductor nanowire 106 and a top surface of the third semiconductor nanowire 108. Then, a planarization process is performed so as for a top surface of the formed first dielectric material 112 to be coplanar with the top surface of the first semiconductor nanowire 104, the top surface of the second semiconductor nanowire 106 and the top surface of the third semiconductor nanowire 108. In an embodiment of the invention, the planarization process may be a chemical-mechanical polishing (CMP) process or an etching-back process.

Figure 1D:
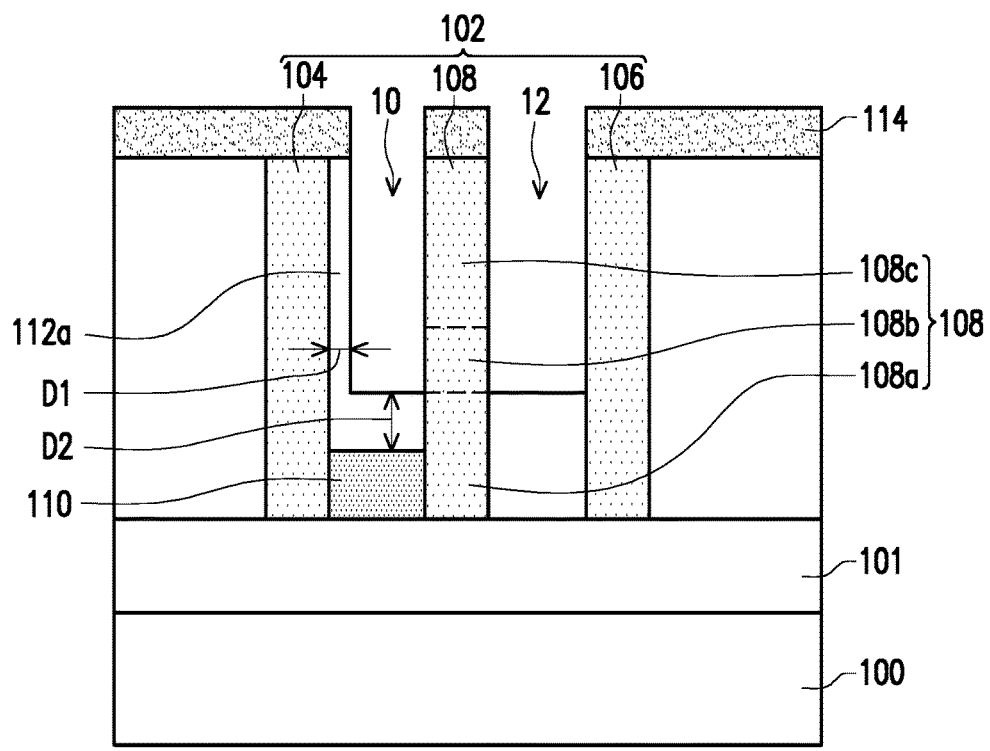
Figure 1E:
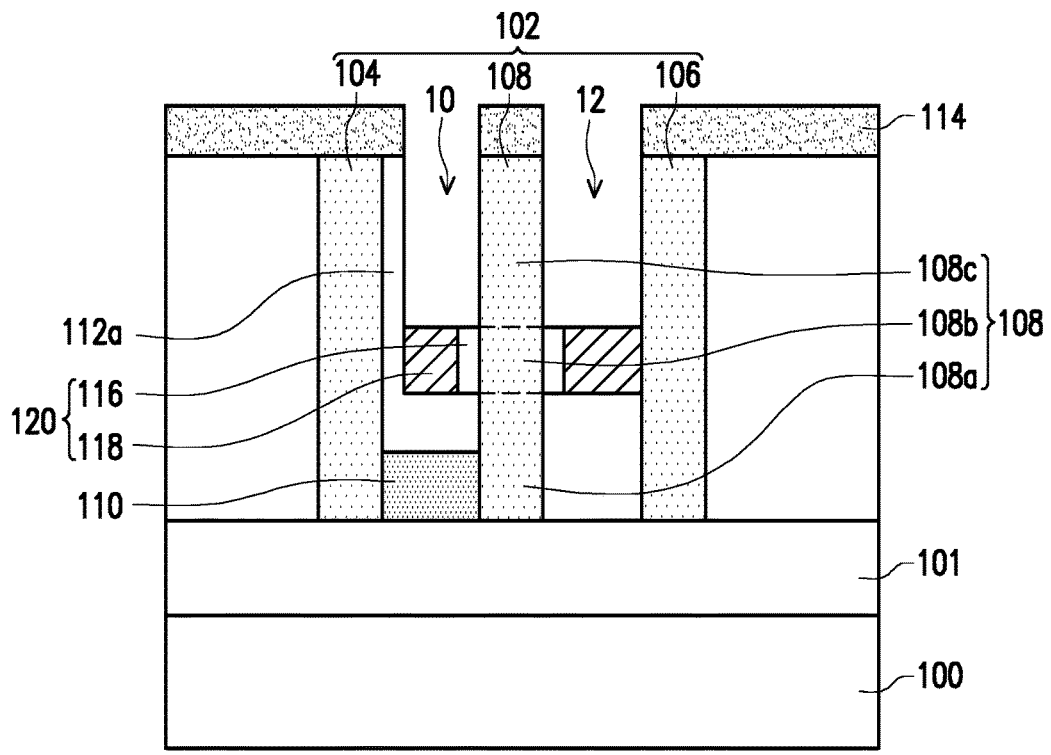

Please refer to FIG. 1C and FIG. 1D. The first dielectric material 112 is patterned to expose a middle portion 108b and an upper portion 108c of the third semiconductor nanowire 108. Specifically, a mask pattern 114 is formed on the first dielectric material 112. The mask pattern 114 covers the top surface of the first semiconductor nanowire 104, the top surface of the second semiconductor nanowire 106, the top surface of the third semiconductor nanowire 108 and a part of the top surface of the first dielectric material 112 and exposes another part of the top surface of the first dielectric material 112. Then, a part of the first dielectric material 112 is removed by using the mask pattern 114 as an etching mask so as to form an opening 10 and an opening 12. The opening 10 is formed between the first semiconductor nanowire 104 and the third semiconductor nanowire 108, and the opening 12 is formed between the second semiconductor nanowire 106 and the third semiconductor nanowire 108. The opening 10 and the opening 12 expose the middle portion 108b and the upper portion 108c of the third semiconductor nanowire 108. In an embodiment of the invention, as shown in FIG. 1D, a width of the opening 10 is narrower than a width of the opening 12. In other words, the opening 10 and the first semiconductor nanowire 104 have a first dielectric material 112a located in between and are at a distance D1 from each other. The distance D1 may allow a gate structure 120 to be formed (as shown in FIG. 1E) to be electronically isolated from a metal nanowire 204 to be formed (as shown in FIG. 1H). Similarly, the opening 10 and the dummy layer 110 are also at a distance D2 from each other. In an embodiment of the invention, the distance D1 may fall within a range from 5 nm to 100 nm, and the distance D2 may fall within a range from 3 nm to 20 nm. In an alternative embodiment of the invention, the opening 10 and the opening 12 may be connected to each other and form a continuous annular opening.

Please refer to FIG. 1E. A gate structure 120 is formed in the opening 10 and the opening 12 to surround the middle portion 108b of the third semiconductor nanowire 108. In an embodiment of the invention, the gate structure 120 may be an annular structure surrounding and covering the middle portion 108b of the third semiconductor nanowire 108. Specifically, a gate dielectric material (not illustrated) may be formed in the opening 10 and the opening 12 to cover a surface of the opening 10 and of the opening 12 conformally. Then, the gate dielectric material is patterned, and a part of the gate dielectric material is removed so as for a remaining part of the gate dielectric material to surround the middle portion 108b and the upper portion 108c of the third semiconductor nanowire 108. Afterwards, the opening 10 and the opening 12 are fully filled with a gate electrode material (not illustrated) so as for the gate electrode material to surround the remaining part of the gate dielectric material and to be connected to the second semiconductor nanowire 106. Next, an etching-back process is performed, and the remaining part of the gate dielectric material surrounding the upper portion 108c of the third semiconductor nanowire 108 and a remaining part of the gate electrode material surrounding the upper portion 108c of the third semiconductor nanowire 108 are removed to form a gate dielectric layer 116 and a gate electrode 118. In an embodiment of the invention, a material of the gate dielectric layer 116 includes silicon oxide or a material with a great dielectric constant greater than 4, such as silicon nitride, tantalum oxide, aluminum oxide, hafnium oxide or a combination thereof. In an embodiment of the invention, a material of the gate electrode 118 includes a conductive material, the conductive material may be, for example, a metal, polycrystalline silicon, a silicide metal or a combination thereof.

As shown in FIG. 1E, the gate dielectric layer 116 surrounds the middle portion 108b of the third semiconductor nanowire 108 and is located between the gate electrode 118 and the middle portion 108b of the third semiconductor nanowire 108. The gate electrode 118 surrounds the gate dielectric layer 116 and is located between the gate dielectric layer 116 and the second semiconductor nanowire 106. In this embodiment of the invention, the gate electrode 118 is connected to the second semiconductor nanowire 106. In an alternative embodiment of the invention, the gate electrode 118 is electronically isolated from the dummy layer 110 and the first semiconductor nanowire 104 by the first dielectric material 112a. In an embodiment of the invention, the middle portion 108b covered by the gate structure 120 may be viewed as a channel region, and the lower portion 108a and the upper portion 108c may be viewed as a source region and a drain region.

Figure 1F:
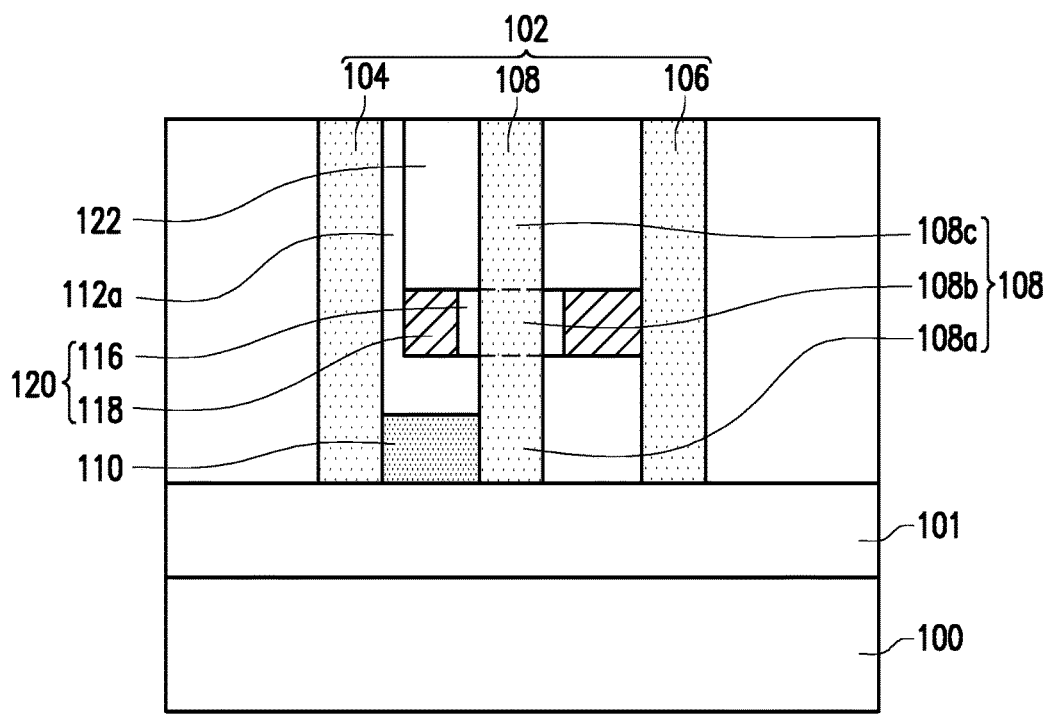

Please refer to FIG. 1E and FIG. 1F. After the mask pattern 114 is removed, a dielectric material (not illustrated) is formed on the substrate 100 to be filled in the opening 10 and the opening 12. Then, a planarization process is performed so as for a second dielectric material 122 to be formed on the gate structure 120. Under the circumstance, a top surface of the second dielectric material 122 is coplanar with the top surface of the first semiconductor nanowire 104, the top surface of the second semiconductor nanowire 106 and the top surface of the third semiconductor nanowire 108. In an embodiment of the invention, a material of the second dielectric material 122 includes silicon oxide, silicon nitride, silicon oxynitride or a material with a small dielectric constant smaller than 4, and a forming method of the second dielectric material 122 includes a chemical vapor deposition (CVD) method.

Figure 1G:
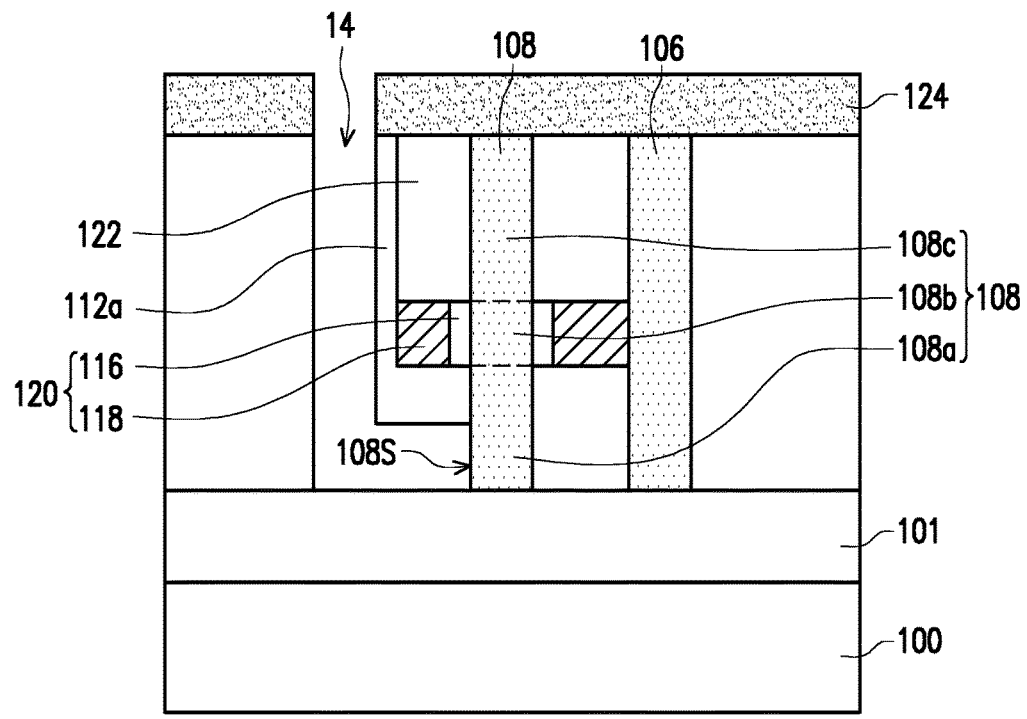
Figure 1H:
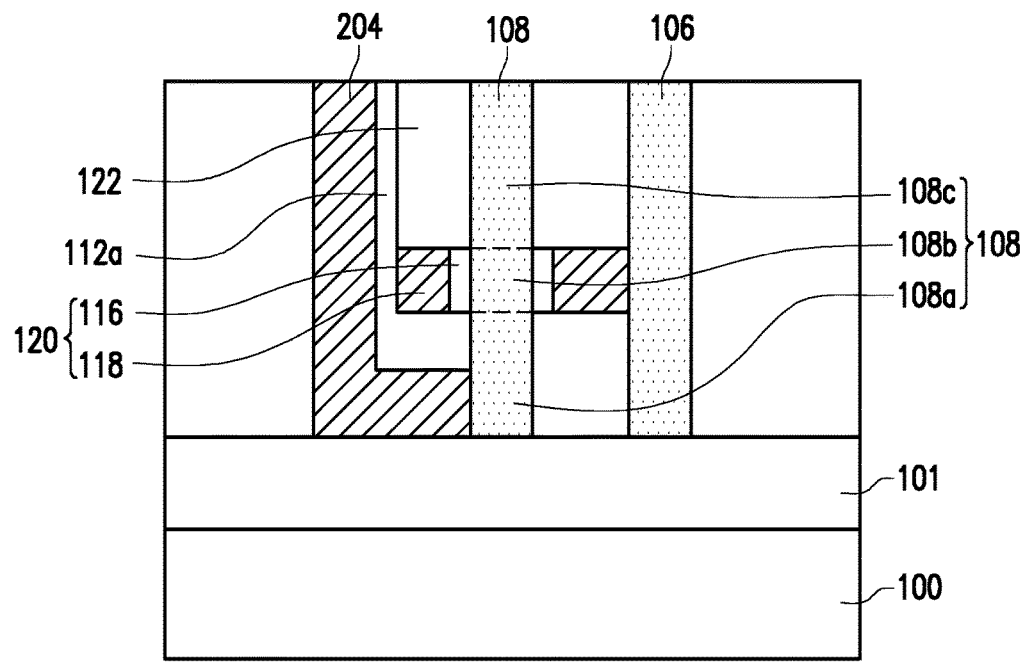

Please refer to FIG. 1F and FIG. 1G. A first mask pattern 124 is formed on the substrate 100 to expose the top surface of the first semiconductor nanowire 104. Then, a first etching process is performed to remove the first semiconductor nanowire 104 and the dummy layer 110, so as to form a first space 14. As shown in FIG. 1G, the first space 14 may be, for example, an L-shaped space, but is not limited thereto. The first space 14 exposes a lower sidewall 108S of the third semiconductor nanowire 108 and a part of a top surface of the isolation layer 101. In an embodiment of the invention, the first etching process includes a wet etching process. In an alternative embodiment of the invention, the first etching process has a high etching selectivity over the first semiconductor nanowire 104 and the dummy layer 110. Therefore, the first semiconductor nanowire 104 and the dummy layer 110 are completely removed, as the first dielectric material 112a and the second dielectric material 122 are not removed or are removed only in a small amount.

Please refer to FIG. 1G and FIG. 1H. After the first mask pattern 124 is removed, a first metal material is filled in the first space 14 to form a first metal nanowire 204. As shown in FIG. 1H, the first metal nanowire 204 may be, for example, an L-shaped structure, but is not limited thereto. In an alternative embodiment of the invention, the first metal nanowire 204 may have a continuous sidewall disposed vertically to the top surface of the substrate 100. In an embodiment of the invention, the first metal nanowire 204 includes a metal, such as tungsten, copper, aluminum or a combination thereof. A forming method of the first metal nanowire 204 includes a CVD method or an electroplating method, etc.

Figure 1I:
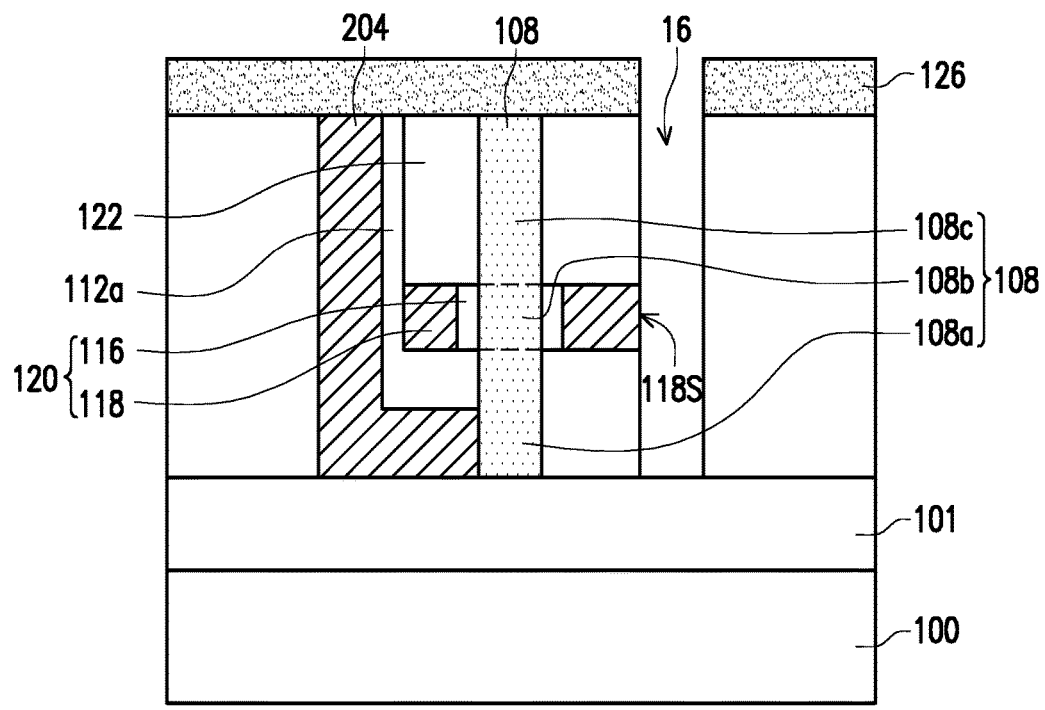

Please refer to FIG. 1H and FIG. 1I. After the first metal nanowire 204 is formed, a second mask pattern 126 is formed on the substrate 100 to expose the top surface of the second semiconductor nanowire 106. A second etching process is performed to remove the second semiconductor nanowire 106, so as to form a second space 16. As shown in FIG. 1I, the second space 16 may be, for example, an I-shaped space, but is not limited thereto. The second space 16 exposes a sidewall 118S of the gate electrode 118 and a part of the top surface of the isolation layer 101. In an embodiment of the invention, the second etching process includes a wet etching process. In an alternative embodiment of the invention, the second etching process has a high etching selectivity over the second semiconductor nanowire 106. Therefore, the second semiconductor nanowire 106 is completely removed, as the first dielectric material 112a and the second dielectric material 122 are not removed or are removed only in a small amount.

Figure 1J:
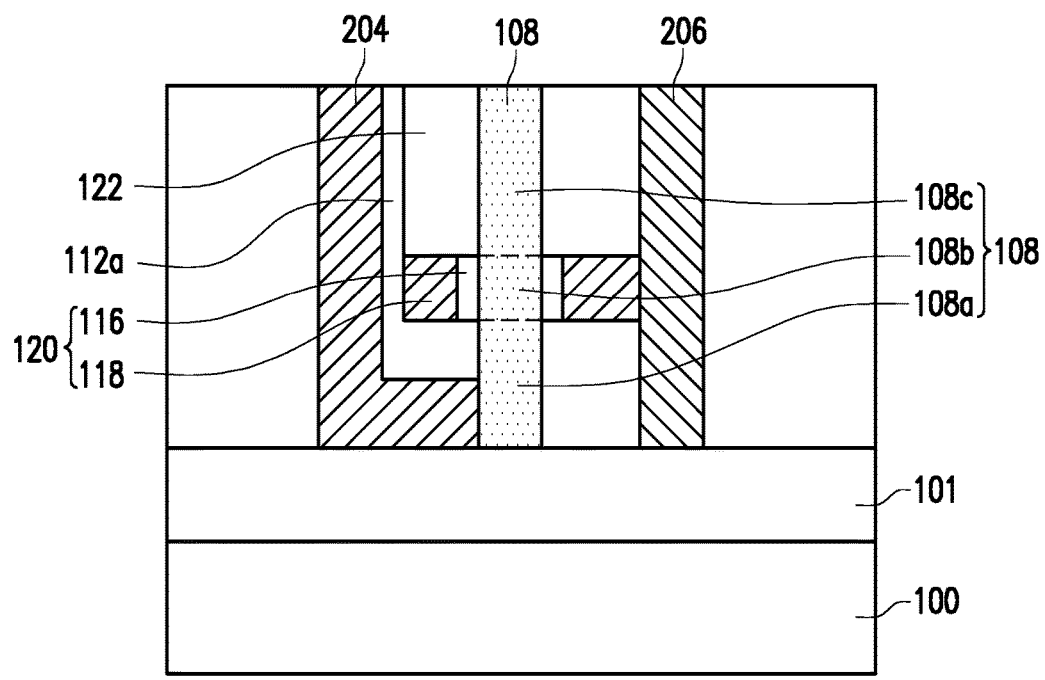

Please refer to FIG. 1I and FIG. 1J. After the second mask pattern 126 is removed, a second metal material is filled in the second space 16 to form a second metal nanowire 206. Therefore, the second metal nanowire 206 may be, for example, an I-shaped structure, but is not limited thereto. In an alternative embodiment of the invention, the second metal nanowire 206 may have a continuous sidewall disposed vertically to the top surface of the substrate 100. In an embodiment of the invention, the second metal nanowire 206 includes a metal, such as tungsten, copper, aluminum or a combination thereof. A forming method of the second metal nanowire 206 includes a CVD method or an electroplating method, etc. In an embodiment of the invention, a material of the first metal nanowire 204 and a material of the second metal nanowire 206 may be different.

Figure 2A:
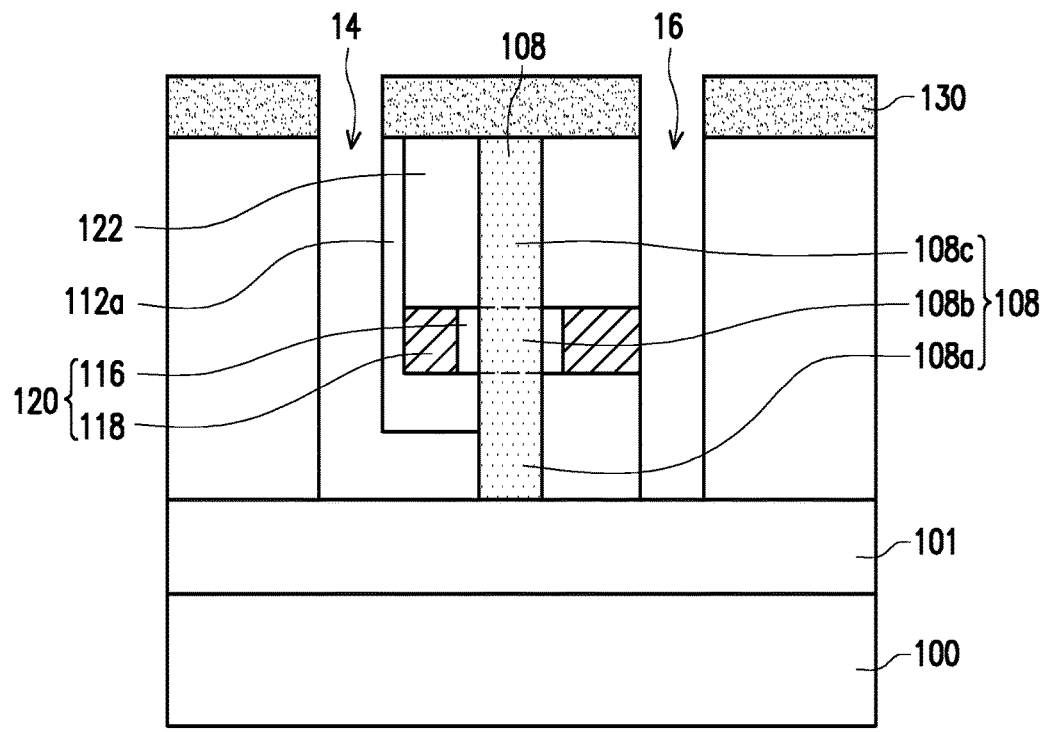
FIG. 2A to FIG. 2B are schematic section views of a manufacturing process of a semiconductor device according to a second embodiment of the invention.

Although the first metal nanowire 204 and the second metal nanowire 206 are formed separately in the above embodiment, the invention is not limited thereto. In other embodiments of the invention, a first metal nanowire 204 and a second metal nanowire 206 may be formed at the same time. As shown in FIG. 2A, (continuing from the step of FIG. 1F,) a third mask pattern 130 is formed on the substrate 100 to expose both the top surface of the first semiconductor nanowire 104 and the top surface of the second semiconductor nanowire 106. A third etching process is performed, the first semiconductor nanowire 104 and the dummy layer 110 are removed to form a first space 14, and, at the same time, the second semiconductor nanowire 106 is removed to form a second space 16.

Figure 2B:
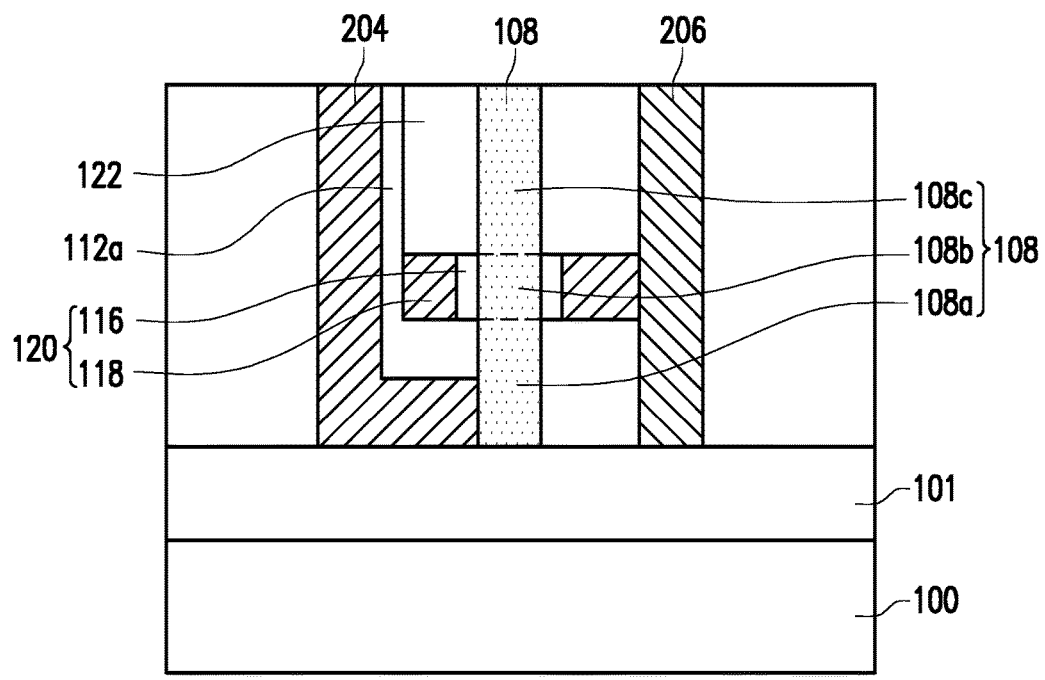

Please refer to FIG. 2A and FIG. 2B. After the third mask pattern 130 is removed, a third metal material is filled in the first space 14 and the second space 16 to form a first metal nanowire 204 and a second metal nanowire 206 at the same time.

Please refer back to FIG. 1J and FIG. 1K. A dielectric layer 128 is formed on the substrate 100. Then, an interconnect 134, an interconnect 136 and an interconnect 138 are formed in the dielectric layer 128. In detail, the interconnect 134 is disposed on and electrically connected to the first metal nanowire 204. The interconnect 136 is disposed on and electrically connected to the second metal nanowire 206. The interconnect 138 is disposed on and electrically connected to the third metal nanowire 108. In an embodiment of the invention, the interconnect 134, the interconnect 136 and the interconnect 138 include a conductive material, the conductive material may be, for example, a metal, a silicide metal or a combination thereof. A forming method of the interconnect 134, the interconnect 136 and the interconnect 138 includes a physical vapor deposition (PVD) method or a CVD method.

It is noteworthy that, in this embodiment, the first semiconductor nanowire 104 and the dummy layer 110 are substituted by the first metal nanowire 204 to form a source/drain contact in an L-shape so that the source/drain contact may be connected to the lower portion 108a of the third semiconductor nanowire 108. In addition, in this embodiment, the second semiconductor nanowire 106 is substituted by the second metal nanowire 206 to form a gate contact in an I-shape so that the gate contact may be connected to the gate structure 120. As a result, in this embodiment, an interconnect layout of a nanowire transistor device may be thereby simplified so as to reduce a chip area. The nanowire transistor device according to this embodiment may thereby be further miniaturized to satisfy the users' needs.

Figure 3:
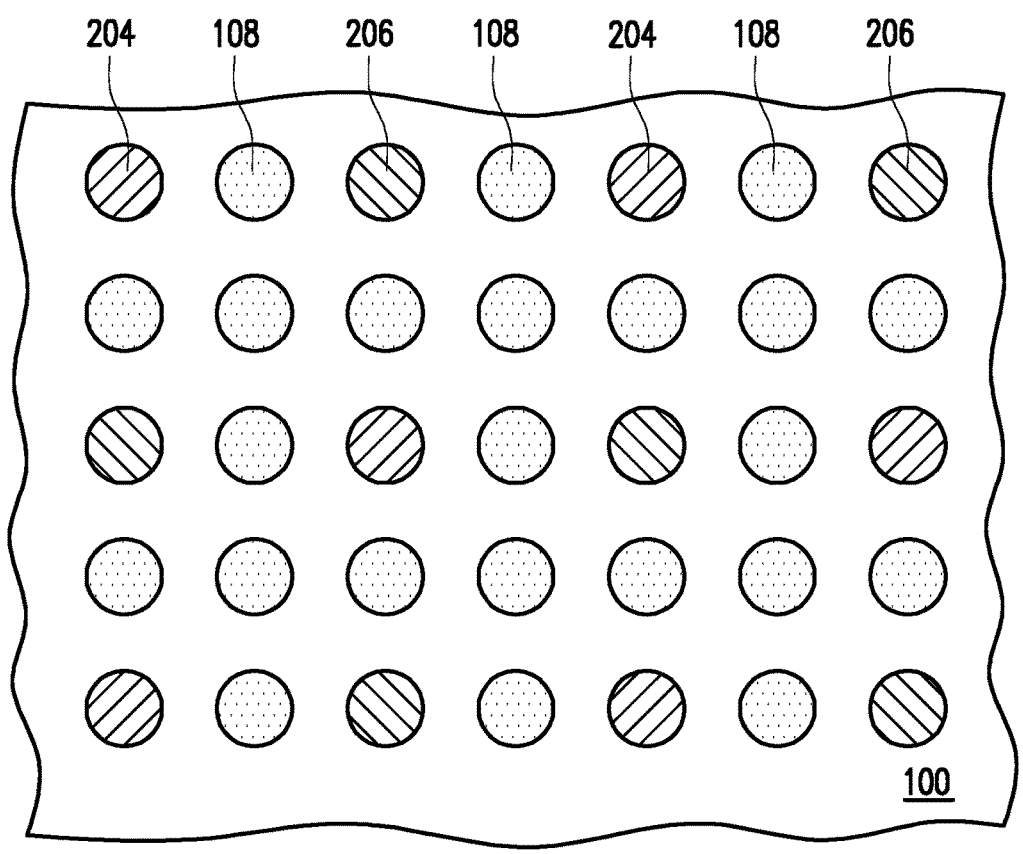
FIG. 3 is a schematic top view of a semiconductor device according to a third embodiment of the invention.

FIG. 3 is a schematic top view of a semiconductor device according to a third embodiment of the invention.

Figure 1K:
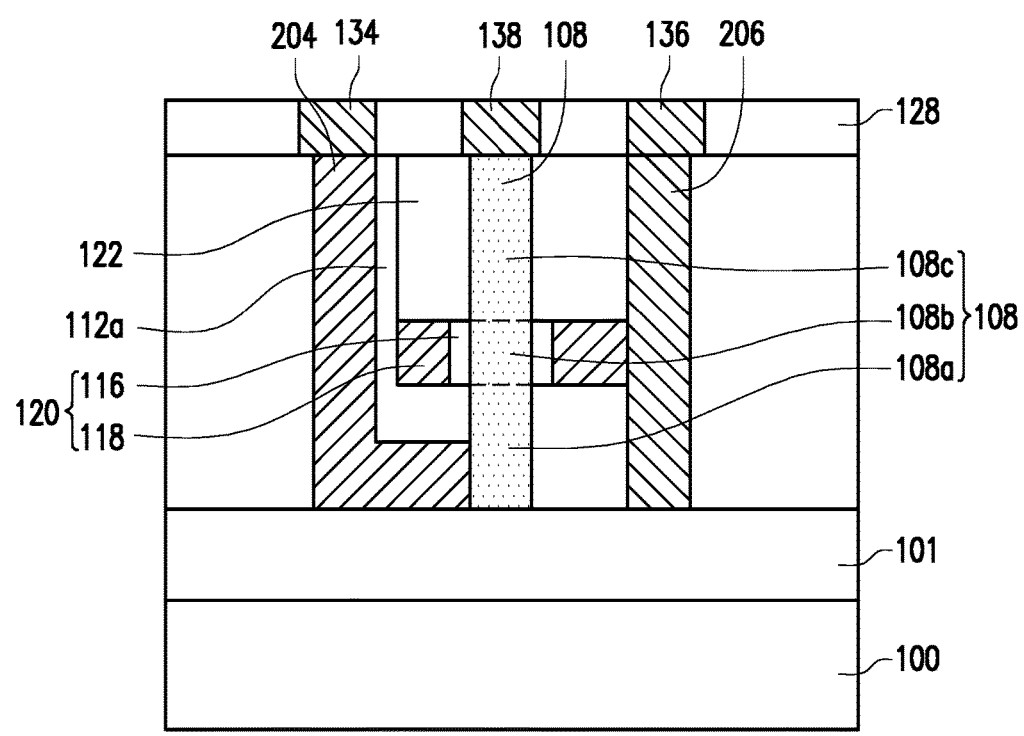

Although only one first metal nanowire 204, one second metal nanowire 206 and one third semiconductor nanowire 108 are illustrated in FIG. 1K, the invention is not limited thereto. In other embodiments of the invention, a number of the first metal nanowire 204 is plural, a number of the second metal nanowire 206 is plural, and a number of the third semiconductor nanowire 108 is plural. The plurality of third semiconductor nanowires 108 may be arranged in a plurality of rows and a plurality of columns. As shown in FIG. 3, the plurality of third semiconductor nanowires 108 surround the plurality of first metal nanowires 204 and the plurality of second metal nanowires 206.

Specifically, as shown in FIG. 3, each one of the plurality of first metal nanowires 204 may be surrounded by eight third semiconductor nanowires 108; each one of the plurality of second metal nanowires 206 may also be surrounded by eight third semiconductor nanowires 108. In other words, each one of the plurality of first metal nanowires 204 may be electrically connected to at least two of the third semiconductor nanowires 108 surrounding the same. In an alternative embodiment of the invention, one of the plurality of first metal nanowires 204 may be electrically connected to more than two third semiconductor nanowires 108 surrounding the same or to eight third semiconductor nanowires 108 surrounding the same. Similarly, each one of the plurality of second metal nanowires 206 may be electrically connected to at least two of the third semiconductor nanowires 108 surrounding the same. In an alternative embodiment of the invention, one of the plurality of second metal nanowires 206 may be electrically connected to more than two third semiconductor nanowires 108 surrounding the same or to eight third semiconductor nanowires 108 surrounding the same.

To sum up, in the invention, one of a plurality of semiconductor nanowires is substituted by a metal nanowire to form a source contact, drain contact, or gate contact and to thereby reduce a chip area. Therefore, a nanowire transistor device of the invention may be further miniaturized to satisfy the users' needs.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A semiconductor device, comprising:
   a semiconductor nanowire disposed vertically on a substrate;
   a gate structure surrounding a middle portion of the semiconductor nanowire;
   a first metal nanowire located on a side of the semiconductor nanowire and electronically connected to a lower portion of the semiconductor nanowire; and
   a second metal nanowire located on another side of the semiconductor nanowire and electronically connected to the gate structure.

2. The semiconductor device according to claim 1, wherein the first metal nanowire comprises an L-shaped structure.

3. The semiconductor device according to claim 1, wherein a number of the semiconductor nanowire is plural, a plurality of semiconductor nanowires is arranged in a plurality of rows and a plurality of columns.

4. The semiconductor device according to claim 3, wherein the plurality of semiconductor nanowires surrounds the first metal nanowire and the second metal nanowire.

5. The semiconductor device according to claim 3, wherein at least two of the plurality of semiconductor nanowires surrounding the first metal nanowire are electrically connected to the first metal nanowire.

6. The semiconductor device according to claim 3, wherein at least two of the plurality of semiconductor nanowires surrounding the second metal nanowire are electrically connected to the second metal nanowire via a corresponding gate structure.

7. The semiconductor device according to claim 1, further comprising an isolation layer disposed between the substrate and the semiconductor nanowire, between the substrate and the first metal nanowire and between the substrate and the second metal nanowire.

8. The semiconductor device according to claim 1, further comprising an interconnect disposed on a top surface of the semiconductor nanowire.

9. The semiconductor device according to claim 1, wherein the gate structure comprises a gate dielectric layer and a gate electrode, the gate dielectric layer located between the gate electrode and the middle portion of the semiconductor nanowire, the gate electrode located between the gate dielectric layer and the second metal nanowire.

\* \* \* \* \*